United States Patent [19]

Holdsworth

[11] Patent Number: 4,701,726

[45] Date of Patent: Oct. 20, 1987

[54] TRAP FILTER ASSEMBLY

[75] Inventor: Timothy M. Holdsworth, Clay, N.Y.

[73] Assignee: Northeast Filter Co., Inc., Syracuse, N.Y.

[21] Appl. No.: 804,063

[22] Filed: Dec. 3, 1985

[51] Int. Cl.[4] .............................................. H03H 7/00
[52] U.S. Cl. ..................................... 333/185; 333/12; 333/167
[58] Field of Search ................. 333/185, 175, 176, 12, 333/167, 168; 174/52 R; 361/395, 399, 415

[56] References Cited

U.S. PATENT DOCUMENTS 4,015,070 5/1977 Theurer ............................. 174/52 R
4,152,671 5/1979 Tuma et al. ................... 174/52 R X
4,451,803 5/1984 Holdsworth et al. .......... 333/185 X

OTHER PUBLICATIONS

Cable Television Business, Sep. 1985, inside cover; p. 73.

Primary Examiner—Eugene R. LaRoche
Assistant Examiner—Seung Ham
Attorney, Agent, or Firm—Bruns and Wall

[57] ABSTRACT

A trap filter assembly, of the type which can be employed with a video cable system to block a particular channel or band of channels and pass the remaining video signal, is formed of a circuit board, a centrally-disposed cylindrical ground block, and a housing formed of male and female housing halves which are press-fit over the circuit board onto the ground block. The housing halves form a solderless connection with the ground block, and the latter forms a solderless connection with ground pads on the printed circuit board. A slot cut in the cylindrical ground block receives the printed circuit board, and a zig-zag channel structure formed in one wall of the slot permits a zig-zag signal lead to extend from one end of the printed circuit board through a ground area of the board, to the other end thereof.

20 Claims, 7 Drawing Figures

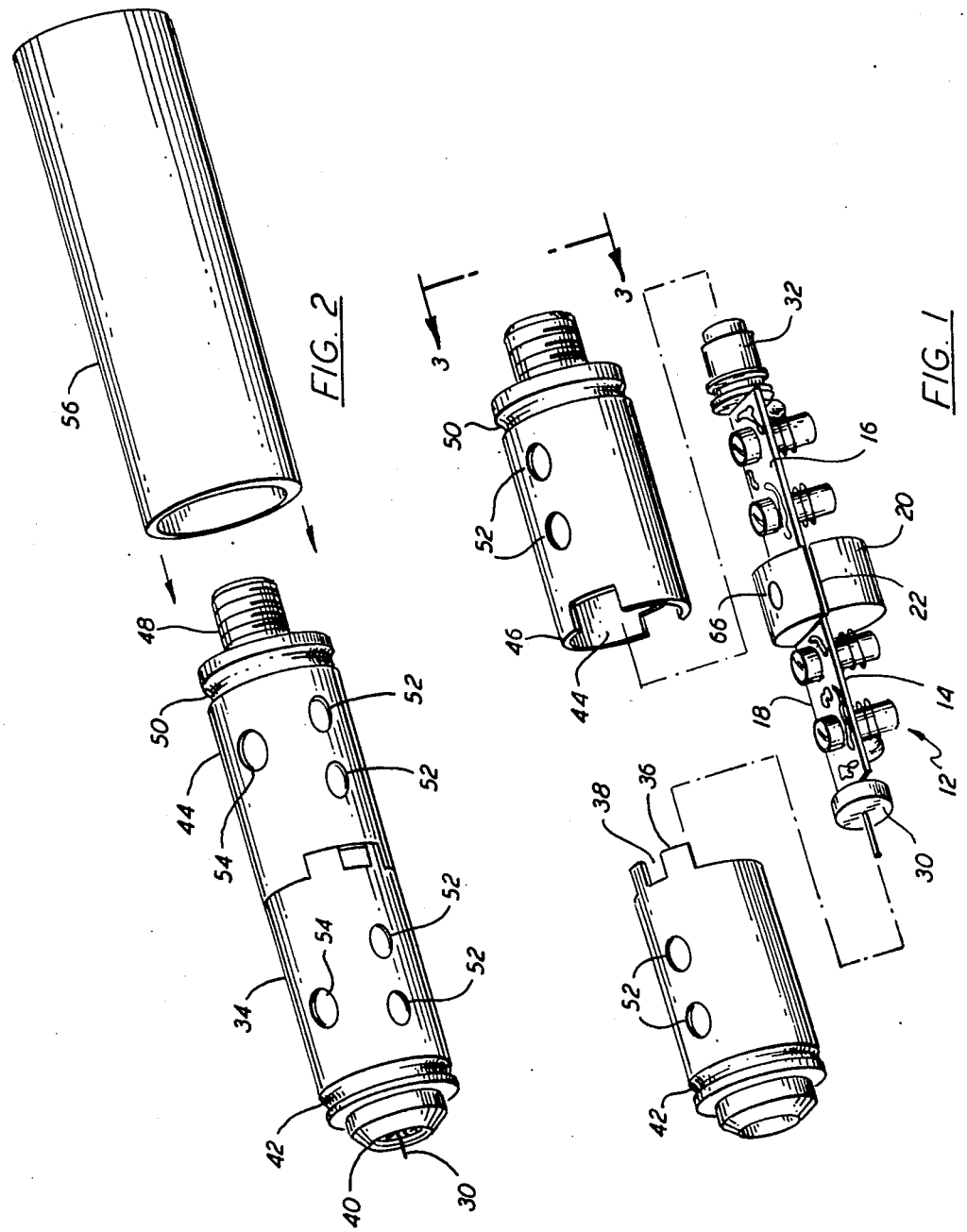

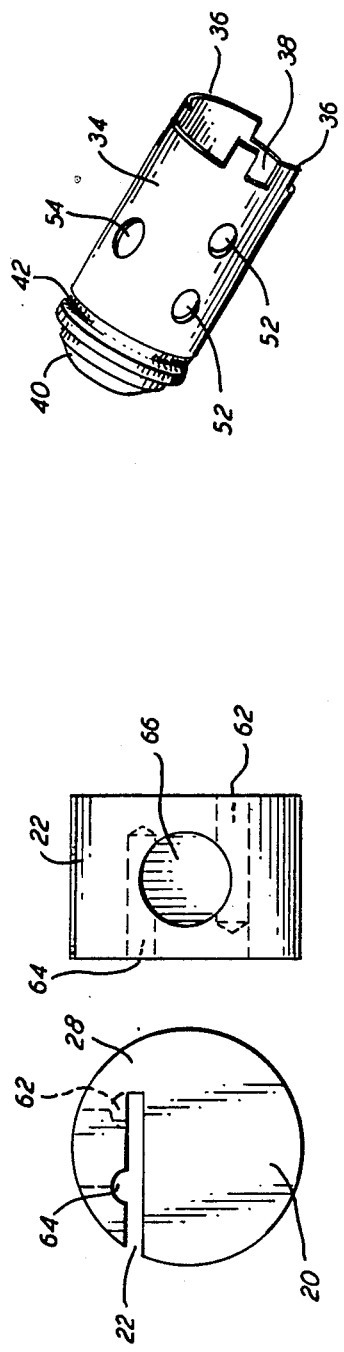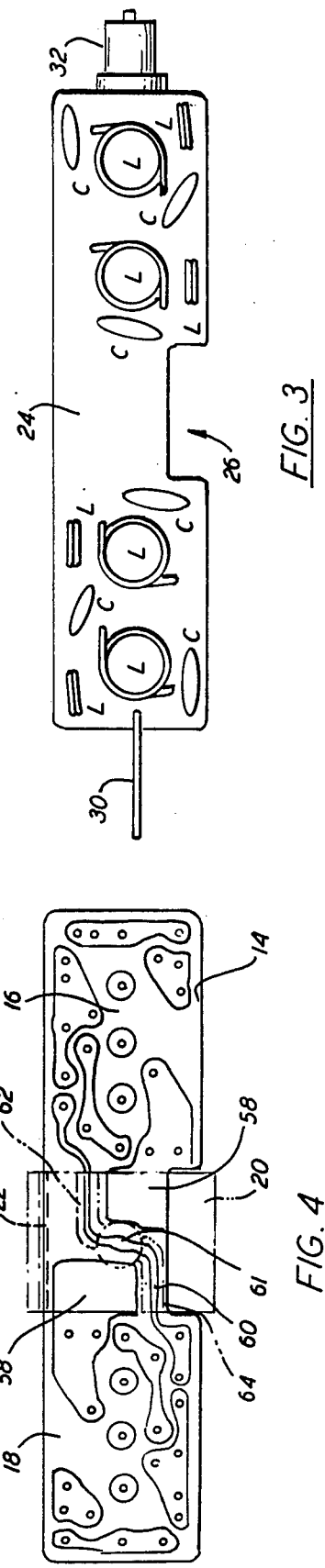

TRAP FILTER ASSEMBLY

BACKGROUND OF THE INVENTION

This invention relates to video filters, and particularly to trap filters or blocking filters of the type that are employed in a cable video system to block a premium or pay channel but to pass other channels. The invention is more specifically directed to the construction of a filter assembly which is factory tunable to a precise channel or band of channels, and which reliably stays tuned after assembly and after being installed outdoors.

Various filters have been previously employed in a television cable system environment to prevent a pay channel from reaching a subscriber who has not subscribed to that particular channel. In any of the filters previously provided for this purpose, a soldered connection to the housing was required to ensure grounding of the filter circuitry and housing. Unfortunately, soldering is a labor-intensive activity: consequently the conventional filters are somewhat expensive. In some previous filters, the filters were constructed in halves, the halves being separately tunable to achieve sufficient attenuation (preferably —70d B), and in a separate step were combined after tuning. These filters however still require internal soldering, and the soldering and assembly steps after tuning further increase production costs.

Moreover, a high failure rate for prior filter devices has kept the average price per acceptable filter unit higher than desirable.

OBJECTS AND SUMMARY OF THE INVENTION

It is an object of this invention to provide a filter assembly that avoids the inherent drawbacks of the prior art.

It is a more specific object to provide a filter assembly that is relatively inexepensive to construct and which is highly reliable.

It is a further object of this invention to provide a filter assembly that has an effective ground connection with the housing, without resort to solder.

It is yet another object of this invention to provide a filter assembly which is accurately tunable to block a particular channel or band of channels.

It is still another object of this invention to provide a filter assembly which can be constructed of lower-cost materials, such as aluminum.

In accordance with an aspect of this invention, a filter assembly for a channel-blocking filter of the type which is finetuned to attenuate a selected channel or band of channels, and then is sealed moisture tight, is formed of a printed circuit board on which is mounted a cylindrical metal ground block, and male and female metal housing halves which fit snugly on the cylindrical surface of the ground block making solderless electrical contact therewith substantially over the circumference of the ground block, and a sealing sleeve over the housing halves that is environmentally sealed for example, with an anaerobic adhesive. The circuit board has a pair of printed filter pole circuit areas formed one on each side of a central grounding area, and a signal lead printed on the central grounding area connects the filter circuits on either side of the central grounding area. Grounding pads are also metallized onto one surface of the board in the central grounding area.

The cylindrical ground block has a predetermined diameter and an outer cylindrical surface. A slot or cutout is formed along a chord of the ground block, and dimensioned so as to permit the ground block to fit snugly over the central grounding area of the printed circuit board, and to press against the ground pads to form a solderless connection with them. At the same time, the block is provided with further cutouts communicating with the slot or cutout so that the signal lead is held out of contact with the ground block.

The male and female metal housing halves each have a cylindrical inside diameter not greater than the predetermined diameter of the ground block, the housing halves fitting snugly onto the ground block and meeting one another on the circumferential surface of the ground block. Openings are provided in each of the housing halves to permit tuning of the adjustable filter circuits after the assembly of the housing halves over the circuit board, and further apertures are provided to permit injection of a filler material, such as polyurethane foam, into the interior of the housing prior to fitting of the sealing sleeve thereon. In a preferred embodiment, the signal lead follows a zig-zag path across the circuit board, so that the filter assembly is kept as short as possible, while maintaining the halves thereof free of mutual interference. Because no solder is required, the metal parts can be formed of aluminum, or of any other convenient conductor material.

The above and many other objects, features, advantages of this invention will be more fully understood from the ensuing detailed description of a preferred embodiment, which should be considered in connection with the accompanying drawing.

BRIEF DESCRIPTION OF THE DRAWING

FIGS. 1 and 2 are exploded views of a trap filter assembly according to a preferred embodiment of this invention.

FIGS. 3 and 4 are a top plan view and a bottom plan view, respectively, of a printed circuit board employed in the preferred embodiment.

FIGS. 5 and 5A, are side and bottom views, respectively, of a cylindrical metal ground block employed in the preferred embodiment.

FIG. 6 is a perspective view of a male half of the housing of the preferred embodiment.

DETAILED DESCRIPTION OF THE PREFERRED EMBODIMENT

With reference to the drawing, and initially to FIGS. 1 and 2 thereof, a filter assembly 10 of a preferred embodiment of this invention includes a four-pole filter circuit 12 on a printed circuit board 14. The filter circuit 12 has two poles thereof on one filter area 16 and another two poles thereof formed in another filter area 18, the areas 16 and 18 being disposed to respective ends of the printed circuit board 14. This board is shown in greater detail in FIGS. 3 and 4.

As shown in FIG. 3, the circuit 12 is formed of several capacitors and coils, with two adjustable coils L being disposed on either filter area 16, 18.

A ground block 20, which is shown in greater detail in FIGS. 5 and 5A, has a slot 22 formed therein and adapted to overfit a grounding area 24 in a central portion of the printed circuit board 14 between the filter areas 16 and 18. A recess 26 is formed to one side of the grounding area 24 to accommodate a web 28, the latter being the portion of the block 20 at the back of the slot 22. A female connector 30 for a standard F-type coaxial fitting extends from the filter area 16 at one end of the board 14, while a male connector 32 extends from the filter area 18 at the other end of the board 14.

A female housing half 34, shown in FIGS. 1 and 6, is formed as a cylindrical member that is crenellated at one end i.e., having a pair of oppositely-disposed teeth 36. At an outer end of the female housing half 34, a threaded sleeve 40 overfits the female connector 30, and an annular groove 42 is provided in the cylindrical surface of the housing half 34 at the outer end thereof.

A male housing half 44, is also crenellated at an open end thereof, with teeth 46 formed therein to mate between the teeth 36 of the female housing half 34. Here, a gap or notch 38 is formed in that one of these teeth 46 reaches beneath the printed circuit board 14. A threaded sleeve 48 at the outer end of the housing half 44 overfits the male pin 32, and another annular groove 50 is formed in the cylindrical surface of the housing half 44 at its outer end.

A pair of tuning openings 52 are formed in each of the housing halves 34 and 44 to permit adjustment of inductance of the poles of the filter circuit 12, and each of the housing halves 34, 44, has an opening 54 for injection of a filling material, such as polyurethane foam.

After the board 14, the cylindrical ground block 20, and the male and female housing halves 44, 34 are assembled together, a sealing sleeve 56 overfits them, as shown. An environmental seal is formed by applying a suitable adhesive material into the annular grooves 42 and 50 prior to assembly of the sleeve 56 thereon. Then the sleeve 56 is crimped at the areas over the groove 42, 50. Examples of suitable adhesives are "262 Threadlock" and "Loctite RC/680" anaerobic retaining compound, both of which are products of the Loctite Corporation.

As shown in FIG. 4, one side of the board 14 is metallized to form ground contact halves 58 against which the ground block 20 (here shown in ghost lines) presses to maintain contact. A signal lead 60 extends between the filter areas 16 and 18 and runs in a zig-zag path, as shown along the portion of the board 14, between the ground pads 58. Here, the signal lead extends axially from the filter area 16 to about the center of the grounding area 24, then transversely across the latter in a central transverse region 61 from one side of the board 14 towards the other, and then axially again to the filter area 18. This zig-zag path of the signal lead 60 around the ground pads 58 shields the filter areas 16 and 18 from interference with one another, and prevents the tuning of the poles of one area 16 or 18 from interfering with the tuning of the poles of the other area 18 or 16.

As shown in FIGS. 5 and 5A, the slot 22 of the cylindrical ground block 20 extends parallel to a diameter, but spaced from the axis of the block 20. A pair of channels 62 and 64 are formed in one wall of the slot 22 and extend at least to the mid-plane of the ground block 20 from respective circular end surfaces thereof. A central bore extends from the bottom of the ground block 20 through to the slot 22, and forms a void that communicates between the channels 62 and 64. The structure of the channels 62, 64 and the connecting bore 66 maintains the ground block 20 out of electric contact with the zig-zag signal lead 60, as illustrated in FIG. 4.

The notch 38 of the male housing half 34 is designed to overlie the position of the bore 66, so that once the housing halves 34 and 44 of the assembly 10 are in place, the central transverse region 61 of the signal lead 60 can serve as a test point accessible from outside the housing halves 34, 44.

In this embodiment, the assembly 10 has an overall length of three to four inches. The ground block has a diameter of about 0.686–0.688 inches, and an axial length of 0.50 inches. The slot 22 is preferably about 0.06 inches across, and is offset by about 0.145 inches from the axis of the block 20. The web portion 28 is on the order of 0.1 inches across.

The male and female housing halves 34, 44 have inside diameters stepped from about 0.665 to about 0.685 inches, and with an initial portion of about 0.692 inches at the open ends of the housing halves 34, 44.

Several notable advantages of the filter assembly of this embodiment are as follows:

The solderless connection of the ground pads 58 of the printed circuit board 14 with the ground block 20, and the solderless connection of the male and female housing halves 34 and 44 with the ground block 20, ensure that there is a reliable ground formed substantially over the entire circumference of the ground block 20, with only the gap of the slot 22 being out of contact with the housing halves 34 and 44. This circumferential ground connection is possible with this construction, but would be difficult or impossible to achieve with a soldered assembly technique.

Because of the zig-zag path of the signal lead 60 and the presence of the ground block 20, the filter areas 16 and 18 are strongly isolated from one another, with the filter poles each being tunable, through the apertures 52, 52 of each housing half 34, 44. Accordingly, the portions of the filter circuit 12 contained within the respective housing halves 34, 44 can be tuned separately. This is far less expensive and less complicated to construct and tune than is a conventional trap filter. This filter assembly can be tuned using less expensive, less sensitive equipment, because of the independent tunability of each filter half. The assembly is considerably shorter than would be possible if the signal lead 60 followed a straight path.

Also, because the connections of the circuit board 14 to the housing 34, 44 are completely solderless, aluminum alloy can be used for the ground block 20, the housing halves 34, 44 and the sealing sleeve 56. This avoids the necessity of tin-plated or nickel-plated copper, or other expensive materials which might otherwise have been required.

The use of the aluminum sealing sleeve 56 and an anaerobic adhesive achieves a good, moisture-proof environmental seal and avoids the need for O-rings.

Moreover, although male and female connectors 32, 30 are used in this embodiment, the filter assembly could be of male-male or female-female configuration.

While a preferred embodiment has been described in detail hereinabove, it should be understood that the invention is not limited to that embodiment, and that many modifications and variations thereof could be effected by those skilled in the art without departure from the scope and spirit of this invention, which is defined in the appended claims.

I claim

1. A filter assembly for a channel blocking filter of the type which is fine tuned to attenuate a selected channel or band of channels and then is sealed moisture tight; comprising a circuit board having printed filter pole circuit areas formed thereon on each side of a central grounding area, with adjustable filter circuits being disposed in said filter pole circuit areas, ground pads formed on said central area and communicating with said adjustable filter circuits, a signal lead printed on said central grounding area out of contact with said pads and connecting said filter circuits, a first connector at one end of said printed circuit board connected to one said filter circuit, and a second connector at the other end of said printed circuit board and connected to the other said filter circuit;

a generally cylindrical metal ground block of a predetermined diameter and having a cylindrical surface and circular ends, and having a chord cutout open at the ends and along said cylindrical surface, said cutout being dimensioned so as to permit said ground block to fit snugly against said central grounding area of said board and to press against said ground pads to form a solderless connection therewith, said block including means holding said ground block out of contact with said signal lead;

a first metal housing half having a cylindrical inside diameter of said ground block and overfitting said first connector, one said printed filter pole circuit area, and a portion of said ground block, said first housing half making solderless electrical contact with said ground block substantially over its circumference;

a second metal housing half having a cylindrical inside surface of a diameter not greater than the predetermined diameter of said ground block and overfitting said second connector, the other said printed filter pole circuit area and the remainder of said ground block, said second housing half making solderless electrical contact with said ground block substantially over its circumference;

said metal housing halves including means permitting tuning of said adjustable filter circuits after assembly of said housing halves over said circuit board and said ground block; and sealing sleeve means environmentally sealing said housing halves.

2. The filter assembly of claim 1 wherein said ground block has its cutout disposed parallel to an axis of the block and to one side thereof, leaving a gap on said cylindrical wall and a web opposite said gap.

3. The filter assembly of claim 2 wherein said printed circuit board has a cutout at one side of said grounding area which mates against said web.

4. The filter assembly of claim 1 wherein said signal lead extends longitudinally on said board, and on one side of a surface thereof, from one said filter circuit to a middle portion of said central grounding area, then transversely across said middle portion, and then longitudinally on the other side of said surface of the board to said other filter circuit.

5. The filter assembly of claim 4 wherein said means holding the ground block out of contact with said signal lead includes longitudinal channels formed in said cutout repectively from said circular ends to a middle part of said block, and a void at said middle part joining said channels.

6. The filter assembly of claim 5 wherein said void is an aperture extending to the cylindrical surface of said ground block, and wherein a gap is provided in one of said housing fittings in registry with said aperture such that a portion of the transversely running part of said signal lead is accessible as an electrical test point.

7. The filter assembly of claim 1 wherein said housing halves have crenellated open ends which interfit with one another on said ground block.

8. The filter assembly of claim 6 wherein one of said housing halves has a tooth in a crenellated open end thereof fitting between corresponding teeth of a crenellated open end of the mating housing half.

9. The filter assembly of claim 8 wherein said tooth has a cutout therethrough which, when said housing halves are in place on said ground block, is in registry with said aperture of said ground block.

10. The filter assembly of claim 1 wherein said sealing sleeve means include a metal tubular cover and an anaerobic adhesive sealing said cover to said housing halves.

11. The filter assembly of claim 10 wherein said housing halves each have a generally cylindrical outer surface, and at mutually remote ends of said housing halves an annular groove formed in the outer cylindrical surface of each respective housing half.

12. The filter assembly of claim 1 wherein said housing halves are formed of an aluminum alloy.

13. The filter assembly of claim 12 wherein said ground block and said sealing means are also formed of an aluminum alloy.

14. The filter assembly of claim 1 in which said filter is a four pole filter, and said printed filter pole circuit areas each include two filter poles, each of which is adjustably tunable.

15. The filter assembly of claim 14 wherein said filter poles are disposed two on each side of said ground block.

16. The filter assembly of claim 1, wherein said housing halves have a length of about three inches and an outside diameter of about three-quarters inch, and said ground block has an axial length of about one-half inch and a diameter of about eleven-sixteenths inch.

17. The filter assembly of claim 16 wherein said inside diameter of said housing halves is about 0.03 inches undersize with respect to the diameter of said ground block.

18. A filter assembly for a channel blocking filter of the type which is fine tuned to attenuate a selected channel or band of channels and then is sealed moisture tight; comprising a circuit board having printed filter pole circuit areas formed thereon on each side of a central grounding area, with adjustable filter circuits being disposed in said filter pole circuit areas, ground pads formed on said central area and communicating with said adjustable filter circuits, connectors at respective ends of the printed circuit board and connected to the respective filter circuits, and a signal lead traversing said central grounding area out of contact with said pads to connect said filter circuits;

a generally round metal ground block of a predetermined diameter and having a round circumferential surface, and having a cutout defining a slot to permit said central grounding area of said board to fit snugly in said ground block, and to press said ground pads against one wall of said slot to achieve solderless electrical contact between the latter and said ground pads, said ground block also including means holding said signal lead out of electrical contact with said ground block;

conductive housing means enclosing said ground block and said circuit board, including fittings over the respective connectors, and achieving solderless electrical contact with said ground block substantially over its circumference; and means environmentally sealing said housing means.

19. The filter assembly of claim 18, wherein said signal lead traverses said central grounding area in a zig-zag path.

20. The filter assembly of claim 18, wherein said ground block and said housing means are formed of aluminum.

* * * * *